(12) United States Patent
Asami et al.

(10) Patent No.: US 11,290,197 B2
(45) Date of Patent: Mar. 29, 2022

(54) CALIBRATION DEVICE, CONVERSION DEVICE, CALIBRATION METHOD, AND COMPUTER-READABLE MEDIUM HAVING RECORDED THEREON CALIBRATION PROGRAM

(71) Applicants: ADVANTEST CORPORATION, Tokyo (JP); The University of Tokyo, Tokyo (JP)

(72) Inventors: Koji Asami, Saitama (JP); Tetsuya Iizuka, Tokyo (JP); Zolboo Byambadorj, Tokyo (JP)

(73) Assignees: ADVANTEST CORPORATION, Tokyo (JP); TOUDAI TLO, Ltd., Tokyo (JP)

( * ) Notice: Subject to any disclaimer, the term of this patent is extended or adjusted under 35 U.S.C. 154(b) by 0 days.

(21) Appl. No.: 17/211,766

(22) Filed: Mar. 24, 2021

(65) Prior Publication Data

US 2021/0336710 A1 Oct. 28, 2021

(30) Foreign Application Priority Data

Apr. 22, 2020 (JP) .............................. JP2020-076379

(51) Int. Cl.
*H04B 17/00* (2015.01)
*H04B 17/11* (2015.01)

(52) U.S. Cl.
CPC .................................. *H04B 17/11* (2015.01)

(58) Field of Classification Search
CPC ...... H04B 17/101; H04B 17/11; H04B 17/21; H04B 17/24
See application file for complete search history.

(56) References Cited

U.S. PATENT DOCUMENTS

| 8,841,923 | B1 | 9/2014 | Vanwiggeren | |
|---|---|---|---|---|
| 9,948,347 | B2 * | 4/2018 | Milenkovic | .............. H04B 1/40 |
| 9,985,812 | B1 | 5/2018 | Hollender | |
| 2006/0262872 | A1 | 11/2006 | Green | |
| 2007/0213022 | A1 * | 9/2007 | Darabi | ................. H03G 3/3084 |
| | | | | 455/232.1 |

(Continued)

OTHER PUBLICATIONS

Moshe Mishali et al., "From theory to practice: Sub-nyquist sampling of sparse wideband analog signals", IEEE Journal of Selected Topics in Signal Processing, vol. 4, No. 2, pp. 375-391, Apr. 2010.

(Continued)

*Primary Examiner* — Tuan Pham

(57) ABSTRACT

There is provided a calibration device including: a calibration signal supply unit configured to supply, as a calibration input signal, a multitone signal having tones in a plurality of frequency bands to a converter configured to multiply an input signal by each of a plurality of signal patterns and limit a band to obtain each of a plurality of bandpass signals, and reconstruct an output signal in accordance with an input signal from the plurality of bandpass signals; a calibration bandpass signal acquisition unit configured to acquire a plurality of calibration bandpass signals obtained by the converter in response to the multitone signal; and a calibration processing unit configured to calibrate a parameter for the reconstruction in the converter based on the plurality of calibration bandpass signals.

20 Claims, 12 Drawing Sheets

(56) References Cited

U.S. PATENT DOCUMENTS

2009/0080563 A1* 3/2009 Chen .................... H03L 7/1976
375/271
2018/0287651 A1 10/2018 Fernando

OTHER PUBLICATIONS

David L. Donoho, "Compressed sensing", in IEEE Transactions on Information Theory, vol. 52, No. 4, pp. 1289-1306, Apr. 2006.
Peng Wang et al., "An Improved Signal Reconstruction of Modulated Wideband Converter Using a Sensing Matrix Built upon Synchronized Modulated Signals", Circuits Syst. Signal Process. 38, Jul. 7, 2019.
Jeong Park et al., "A calibration for the modulated wideband converter using sinusoids with unknown phases", 2017 Ninth International Conference on Ubiquitous and Future Networks (ICUFN), Milan, 2017, pp. 951-955.
Laming Chen et al., "A calibration system and perturbation analysis for the Modulated Wideband Converter", IEEE 10th International Conference on Signal Processing Proceedings, Beijing, 2010, pp. 78-81.
Weisong Liu et al., "Design of a Single Channel Modulated Wideband Converter for Wideband Spectrum Sensing: Theory, Architecture and Hardware Implementation", Sensors (Basel, Switzerland) vol. 17, 5 1035.4 May 2017.
Etgar Israeli et al., "Hardware calibration of the modulated wideband converter", 2014 IEEE Global Communications Conference, Austin, TX, 2014, pp. 948-953.
Ning Fu et al., "Successive-phase correction calibration method for modulated wideband converter system", in IET Signal Processing, vol. 13, No. 6, pp. 624-632, 8 2019.
Stephen Boyd, "Multitone signals with low crest factor", IEEE Trans Circuits Syst., vol. CAS-33, No. 10, pp. 1018-1022, Oct. 1986.

* cited by examiner

CALIBRATION DEVICE, CONVERSION DEVICE, CALIBRATION METHOD, AND COMPUTER-READABLE MEDIUM HAVING RECORDED THEREON CALIBRATION PROGRAM

The contents of the following Japanese patent application(s) are incorporated herein by reference:
NO. 2020-076379 filed in JP on Apr. 22, 2020

BACKGROUND

1. Technical Field

The present invention relates to a calibration device, a conversion device, a calibration method, and a computer-readable medium having recorded thereon a calibration program.

2. Related Art

Compressed sensing is a technique for sampling a narrowband signal which exists sparsely in a wide frequency band. As a converter that performs the compressed sensing, a modulated wideband converter (MWC: Modulated Wideband Converter) is known (Non-Patent Documents 1 and 2). The MWC uses a plurality of signals obtained by multiplying an input signal in a wideband, in which a narrowband signal sparsely exists, by each of a plurality of periodic sign functions (PSF: Periodic Sign Function) to sample the multiplied input signal, and reconstructs the original input signal. Non-Patent Documents 3 to 8 disclose a technique for calibrating (calibration) such an MWC.

CITATION LIST

Non-Patent Document

[Non-Patent Document 1] Mishali and Y. C. Eldar, "From theory to practice: Sub-nyquist sampling of sparse wideband analog signals", IEEE Journal of Selected Topics in Signal Processing, vol. 4, no. 2, pp. 375-391, April 2010
[Non-Patent Document 2] D. L. Donoho, "Compressed sensing", in IEEE Transactions on Information Theory, vol. 52, no. 4, pp. 1289-1306, April 2006
[Non-Patent Document 3] Peng Wang, Fei You, and Songbai He, "An Improved Signal Reconstruction of Modulated Wideband Converter Using a Sensing Matrix Built upon Synchronized Modulated Signals", Circuits Syst. Signal Process. 38, 7, July 2019
[Non-Patent Document 4] J. Park, J. Jang and H. Lee, "A calibration for the modulated wideband converter using sinusoids with unknown phases", 2017 Ninth International Conference on Ubiquitous and Future Networks (ICUFN), Milan, 2017, pp. 951-955
[Non-Patent Document 5] L. Chen, J. Jin and Y. Gu, "A calibration system and perturbation analysis for the Modulated Wideband Converter", IEEE 10th International Conference on Signal Processing Proceedings, Beijing, 2010, pp. 78-81
[Non-Patent Document 6] Liu, Weisong et al., "Design of a Single Channel Modulated Wideband Converter for Wideband Spectrum Sensing: Theory, Architecture and Hardware Implementation", Sensors (Basel, Switzerland) vol. 17, 5 1035.4 May. 2017
[Non-Patent Document 7] E. Israeli et al., "Hardware calibration of the modulated wideband converter", 2014 IEEE Global Communications Conference, Austin, Tex., 2014, pp. 948-953
[Non-Patent Document 8] N. Fu, S. Jiang, L. Deng and L. Qiao, "Successive-phase correction calibration method for modulated wideband converter system", in IET Signal Processing, vol. 13, no. 6, pp. 624-632, 8 2019
[Non-Patent Document 9] S. Boyd, "Multitone signals with low crest factor", IEEE Trans. Circuits Syst., vol. CAS-33, no. 10, pp. 1018-1022, October 1986

SUMMARY

A first aspect of the present invention provides a calibration device. The calibration device may include a calibration signal supply unit configured to supply, as a calibration input signal, a multitone signal having tones in a plurality of frequency bands to a converter configured to multiply an input signal by each of a plurality of signal patterns and limit a band to obtain each of a plurality of bandpass signals, and reconstruct an output signal in accordance with the input signal from the plurality of bandpass signals. The calibration device may include a calibration bandpass signal acquisition unit configured to acquire a plurality of calibration bandpass signals obtained by the converter in response to the multitone signal. The calibration device may include a calibration processing unit configured to calibrate a parameter for the reconstruction in the converter based on the plurality of calibration bandpass signals.

The calibration input signal may have a tone in each of the plurality of frequency bands which centers a frequency that is an integer multiple of a repetition frequency of the plurality of signal patterns, and has a width of the repetition frequency, the plurality of frequency bands being different from each other.

Tones in two different frequency bands among the plurality of frequency bands may have a frequency difference offset from the integer multiple of the repetition frequency.

The calibration input signal may have the tones in the plurality of frequency bands obtained by dividing a frequency range as a detection target in the input signal by each repetition frequency.

When a fundamental frequency is $f_0$, the repetition frequency is fp, an offset frequency is $\Delta f$, and l is an integer, the calibration input signal may have a tone with a frequency of $f_0 + l \cdot fp + l\Delta f$ in the frequency range as the detection target.

The calibration signal supply unit may be configured to shift initial phases of a plurality of tones to keep a maximum amplitude of the calibration input signal within a rated range of the converter.

A second aspect of the present invention provides a conversion device. The conversion device may include a converter configured to multiply an input signal by each of a plurality of signal patterns and limit a band to obtain each of a plurality of bandpass signals, and reconstruct an output signal in accordance with the input signal from the plurality of bandpass signals. The conversion device may include the calibration device.

The converter may have a plurality of mixers configured to multiply the input signal by each of the plurality of signal patterns. The converter may have a plurality of bandpass filters configured to respectively limit bands of a plurality of signals which are output by the plurality of mixers. The converter may have a plurality of AD converters configured to output the plurality of bandpass signals obtained by respectively sampling signals that have passed through the plurality of bandpass filters. The converter may have a reconstruction unit configured to reconstruct the output signal from the plurality of bandpass signals.

A third aspect of the present invention provides a calibration method. In the calibration method, a multitone signal having tones in a plurality of frequency bands may be supplied, as a calibration input signal, to a converter configured to multiply an input signal by each of a plurality of signal patterns and limit a band to obtain each of a plurality of bandpass signals, and reconstruct an output signal in accordance with the input signal from the plurality of bandpass signals. In the calibration method, a plurality of calibration bandpass signals obtained by the converter in response to the multitone signal may be acquired. In the calibration method, a parameter for the reconstruction in the converter may be calibrated based on the plurality of calibration bandpass signals.

A fourth aspect of the present invention provides a computer-readable medium having recorded thereon a calibration program that is executed by a computer. The calibration program may cause the computer to function as a calibration signal supply unit configured to supply, as a calibration input signal, a multitone signal having tones in a plurality of frequency bands to a converter configured to multiply an input signal by each of a plurality of signal patterns and limit a band to obtain each of a plurality of bandpass signals, and reconstruct an output signal in accordance with the input signal from the plurality of bandpass signals. The calibration program may cause the computer to function as a calibration bandpass signal acquisition unit configured to acquire a plurality of calibration bandpass signals obtained by the converter in response to the multitone signal. The calibration program may cause the computer to function as a calibration processing unit configured to calibrate a parameter for the reconstruction in the converter based on the plurality of calibration bandpass signals.

The summary clause does not necessarily describe all necessary features of the embodiments of the present invention. The present invention may also be a sub-combination of the features described above.

DESCRIPTION OF EXEMPLARY EMBODIMENTS

Hereinafter, the invention will be described through embodiments of the invention, but the following embodiments do not limit the invention according to claims. Further, not all of the combinations of features described in the embodiments are essential for means to solve the problem in the invention.

Figure 1:
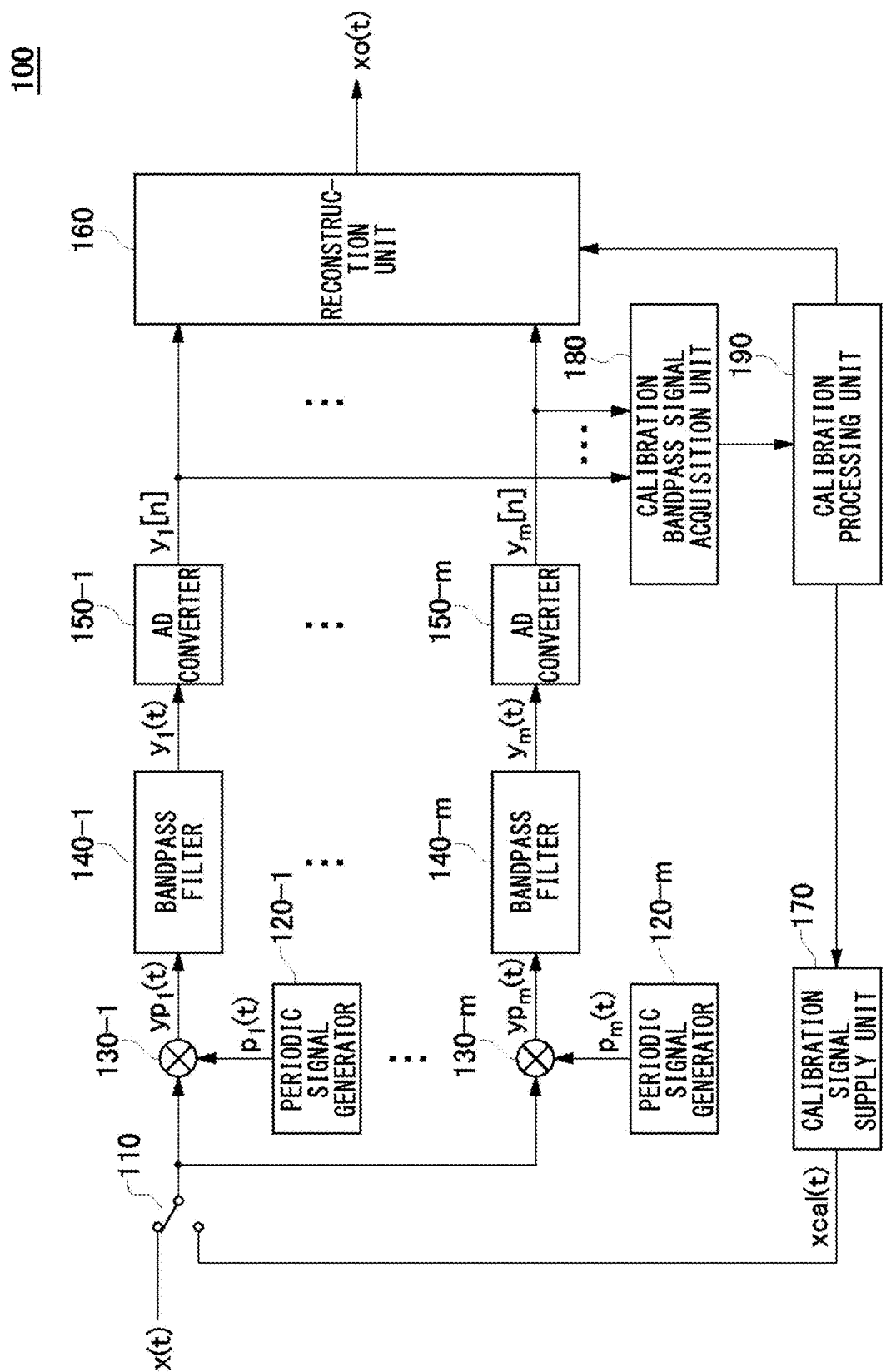
FIG. 1 shows a configuration of a conversion device according to the present embodiment.

FIG. 1 shows a configuration of a conversion device 100 according to the present embodiment. The conversion device 100 samples an analog input signal x(t) which may be a narrowband signal existing sparsely in a wide frequency band, and outputs the signal as a digital output signal xo(t). Here, t indicates a time. Further, the conversion device 100 has a function of performing calibration by using a calibration input signal xcal(t) instead of the external input signal x(t).

The conversion device 100 includes a selector 110, periodic signal generators 120-1 to m, mixers 130-1 to m, bandpass filters 140-1 to m, AD converters 150-1 to m, a reconstruction unit 160, and a calibration signal supply unit 170, a calibration bandpass signal acquisition unit 180, and a calibration processing unit 190. The periodic signal generators 120-1 to m, the mixers 130-1 to m, the bandpass filters 140-1 to m, the AD converters 150-1 to m, and the reconstruction unit 160 function as a converter that multiplies the analog input signal x(t) by each of a plurality of signal patterns $p_i(t)$ (where i is an integer, and 1≤i≤m), and limits a band to obtain each of a plurality of bandpass signals $y_i[n]$, and reconstructs the output signal xo(t) in accordance with an input signal x(t) from the plurality of bandpass signals $y_i[n]$. This converter may be an MWC.

The plurality of periodic signal generators 120-1 to m (hereinafter, also referred to as "periodic signal generators 120") respectively generate the signal patterns $p_i(t)$ which are different from each other. The signal pattern $p_i(t)$ according to the present embodiment is a periodic sign function (PSF: Periodic Sign Function) that has a predetermined period Tp, and has a positive or negative sign (for example, ±1) for each section obtained by dividing the period Tp by M. Here, a repetition frequency fp (Hz) of the signal pattern is 1/Tp. Note that the plurality of periodic signal generators 120 may be configured to start the generations of the signal patterns $p_i(t)$ at the same timing by using a clock of the period Tp as a trigger.

The plurality of mixers 130-1 to m (hereinafter, also referred to as "mixers 130") are connected to the selector 110 and the plurality of periodic signal generators 120, and multiply the input signal x(t) by each of the plurality of signal patterns $p_i(t)$. Then, the plurality of mixers 130 output signals $yp_i(t)=x(t) \, p_i(t)$.

The plurality of bandpass filters 140-1 to m (hereinafter also referred to as "bandpass filters 140") are connected to the plurality of mixers 130, and respectively limit bands of the plurality of signals $yp_i(t)$ which are output by the plurality of mixers 130. Then, the plurality of bandpass filters 140 output a plurality of signals $y_i(t)$ obtained by limiting the bands.

The plurality of AD converters 150-1 to m (hereinafter, also referred to as "AD converters 150") are connected to the plurality of bandpass filters 140, and output the plurality of digital bandpass signals $y_i[n]$ obtained by respectively sampling the signals $y_i(t)$ that have passed through the plurality of bandpass filters 140. Here, each sampling frequency of the plurality of AD converters 150 is represented by fs (Hz). The sampling frequency fs is higher than the frequency fp of the sign of the signal pattern $p_i(t)$, for example, fs≥fp. A sign n indicates a discrete time for each sampling timing, and t=n·Ts.

The reconstruction unit 160 is connected to the plurality of AD converters 150, and reconstructs the output signal xo(t) in accordance with the input signal x(t) from the plurality of bandpass signals $y_i[n]$. Here, the output signal xo(t) is a signal obtained by converting the analog x(t) into the digital signal. Alternatively, the output signal xo(t) of the reconstruction unit 160 may be an analog or digital signal obtained by down-converting the analog x(t) or the like. The reconstruction unit 160 may be realized by dedicated circuitry, or may be realized by programmable circuitry. Further, the reconstruction unit 160 may be realized by executing a reconstruction program on a computer.

The selector 110, the calibration signal supply unit 170, the calibration bandpass signal acquisition unit 180, and the calibration processing unit 190 function as a calibration device that calibrates the above described converter which converts the input signal x(t) into the output signal xo(t). Such a calibration device may be realized by dedicated circuitry, or may be realized by programmable circuitry. Further, the calibration device may be realized by executing a reconstruction program on a computer.

The selector 110 switches between inputting the external input signal x(t) to the converter, and inputting the calibration input signal xcal(t) to the converter. The selector 110 is connected to the calibration signal supply unit 170, and inputs the external input signal x(t) to the plurality of mixers 130 during a normal operation of the conversion device 100, and inputs the calibration input signal xcal(t) from the calibration signal supply unit 170 to the plurality of mixers 130 during a calibration operation of the conversion device 100.

The calibration signal supply unit 170 is connected to the calibration processing unit 190, generates the calibration input signal xcal(t) in response to an instruction from the calibration processing unit 190, and supplies the generated signal to the converter via the selector 110. Similarly to the input signal x(t), the calibration input signal xcal(t) is converted into the plurality of calibration bandpass signals $y_i[n]$ by the plurality of mixers 130, the plurality of bandpass filters 140, and the plurality of AD converters 150.

The calibration bandpass signal acquisition unit 180 is connected to the plurality of AD converters 150. The calibration bandpass signal acquisition unit 180 acquires the plurality of the calibration bandpass signals $y_i[n]$ obtained by the converter in response to the calibration input signal xcal(t).

The calibration processing unit 190 is connected to the calibration bandpass signal acquisition unit 180, and performs the calibration operation. In the calibration operation, the calibration processing unit 190 instructs the selector 110 to switch so as to supply the calibration input signal xcal(t) to the converter, and instructs the calibration signal supply unit 170 to generate the calibration input signal xcal(t). The calibration processing unit 190 calibrates a parameter for the reconstruction in the converter based on the plurality of calibration bandpass signals $y_i[n]$ acquired by the calibration bandpass signal acquisition unit 180 in response to the calibration input signal xcal(t). The calibration processing unit 190 according to the present embodiment sets or adjusts the parameter for the reconstruction which is used by the reconstruction unit 160.

Figure 2:
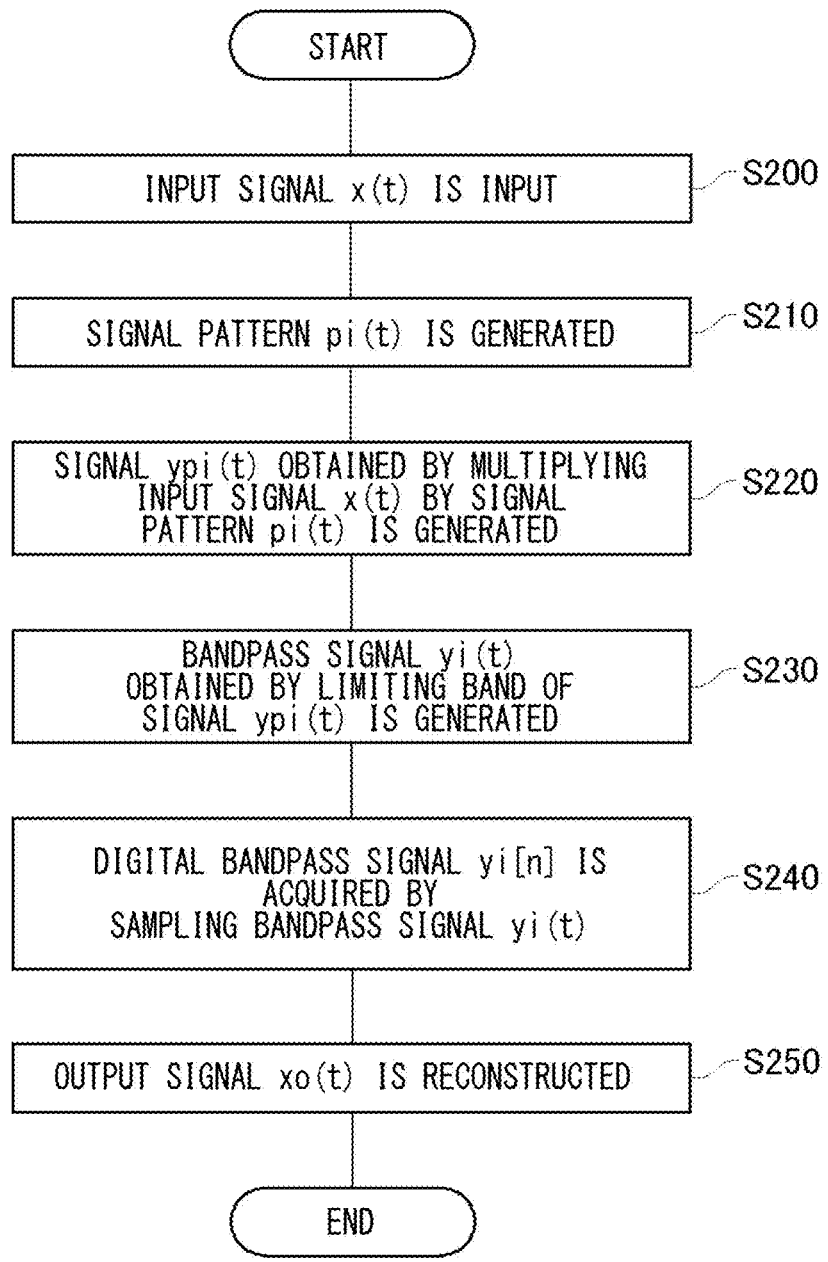
FIG. 2 shows an example of a sampling flow of the conversion device according to the present embodiment.

FIG. 2 shows an example of a sampling flow of the conversion device 100 according to the present embodiment. In step 200 (S200), the conversion device 100 inputs the input signal x(t). In the normal operation, the selector 110 supplies the input signal x(t) to the plurality of mixers 130.

In S210, the plurality of periodic signal generators 120 generate the plurality of signal patterns $p_i(t)$. In S220, the plurality of mixers 130 generate and output the plurality of signals $yp_i(t)$ obtained by multiplying the input signal x(t) by each of the plurality of signal patterns $p_i(t)$.

In S230, the plurality of bandpass filters 140 generate and output the plurality of bandpass signals $y_i(t)$ obtained by limiting the bands of the plurality of signals $yp_i(t)$. In S240, the plurality of AD converters 150 acquire the plurality of digital bandpass signals $y_i[n]$ by sampling and AD (Analog-Digital)-converting the plurality of bandpass signals $y_i(t)$.

In S250, the reconstruction unit 160 reconstructs the output signal xo(t) based on the plurality of bandpass signals $y_i[n]$. Hereinafter, the sampling operation of the conversion device 100 will be described more specifically by using FIG. 3 to FIG. 7.

Figure 3:
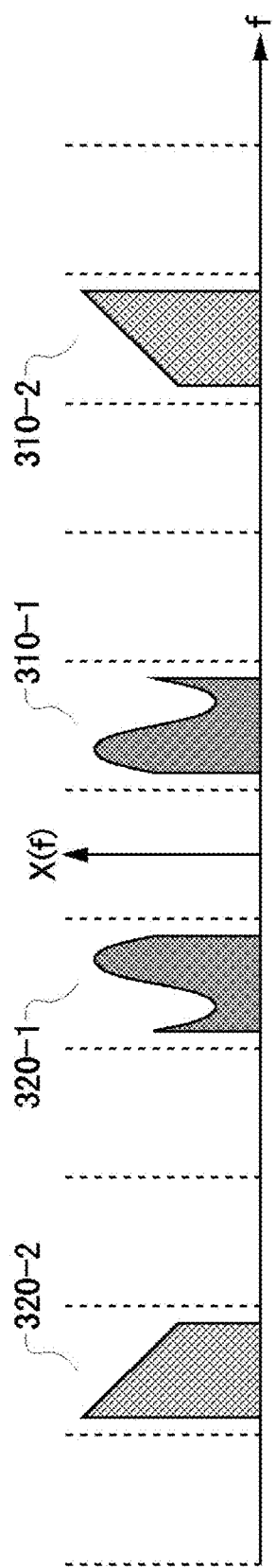
FIG. 3 shows an example of a waveform of an input signal X(f) in a frequency domain.

FIG. 3 shows an example of a waveform of an input signal X(f) in a frequency domain. The input signal x(t) is a narrowband signal of 20 MHz, for example, which exists in a part of a wide frequency band of 2.4 GHz, for example. Accordingly, in the frequency domain where a horizontal axis represents a frequency, and a vertical axis represents an amplitude of each frequency component as shown in FIG. 3, the input signal x(t) is the input signal X(f) which has narrowband signals 310-1 to 2 and corresponding signals 320-1 to 2 with negative frequency components, in a part of the wide frequency band.

Figure 4:
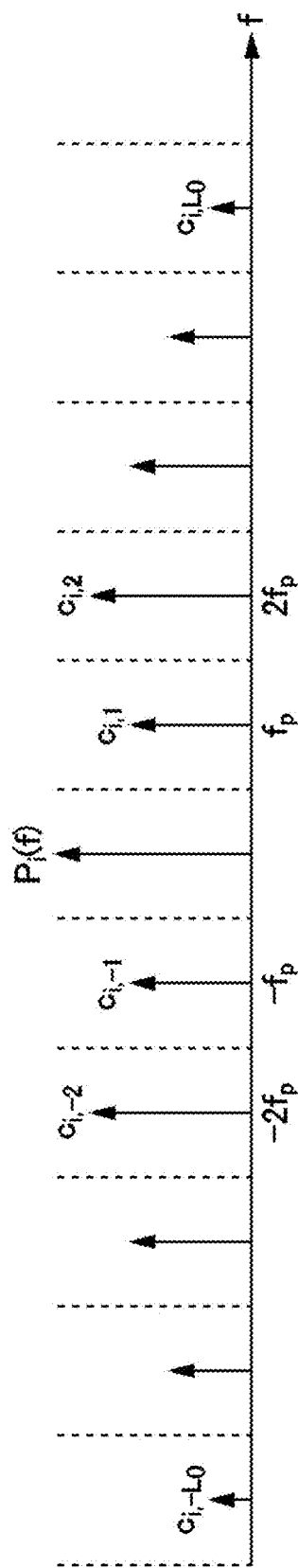
FIG. 4 shows an example of a waveform of a signal pattern $P_i(f)$ in the frequency domain.

FIG. 4 shows an example of a waveform of a signal pattern $P_i(f)$ in the frequency domain. The signal pattern $p_i(t)$ has the period Tp. Accordingly, the Fourier expansion is possible as shown in the following Expression (1).

[Math. 1]

$$p_i(t) = \sum_{l=-\infty}^{\infty} c_{i,l} e^{j\frac{2\pi}{T_p}lt} \quad (1)$$

Based on Expression (1), the signal pattern $P_i(f)$ obtained by representing the signal pattern $p_i(t)$ in the frequency domain is represented in the range of l=−$L_0$ to $L_0$ as shown in FIG. 4. Here, $c_{i,l}$ indicates a frequency component of a frequency l·fp in the signal pattern $P_i(f)$ in the frequency domain.

Figure 5:
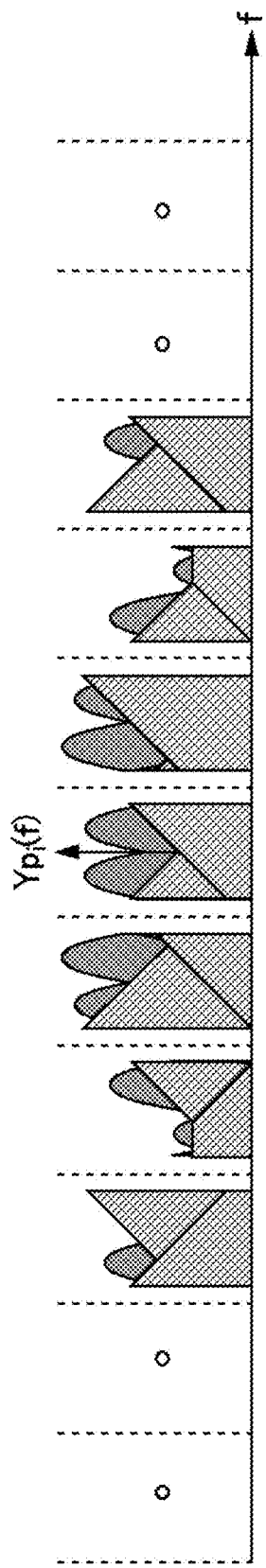
FIG. 5 shows an example of a waveform of a signal $Yp_i(f)$ obtained by multiplying the input signal and the signal pattern $P_i(f)$ in the frequency domain.

FIG. 5 shows an example of a waveform of a signal $Yp_i(f)$ obtained by multiplying the input signal X(f) and the signal pattern $P_i(f)$ in the frequency domain. The signal $Yp_i(f)$ in the frequency domain is a signal obtained by converting the signal $yp_i(t)=x(t) p A)$ in a time domain into a signal in the frequency domain, and is represented by the Fourier transform shown in the following Expression (2).

[Math. 2]

$$Yp_i(f) = \int_{-\infty}^{\infty} x(t)p_i(t)e^{-j2\pi ft} = \sum_{l=-\infty}^{\infty} c_{i,l} X(f - lfp) \quad (2)$$

Based on Expression (2), the signal $Yp_i(f)$ is a sum obtained by shifting the input signal $X(f)$ by an integer multiple lfp of fp to be weighted by each frequency component $c_{i,l}$ of $p_i(f)$ as shown in FIG. 5. In this way, the converter can frequency-convert the narrowband signal existing sparsely in the wide frequency band to the vicinity of a baseband.

Figure 6:
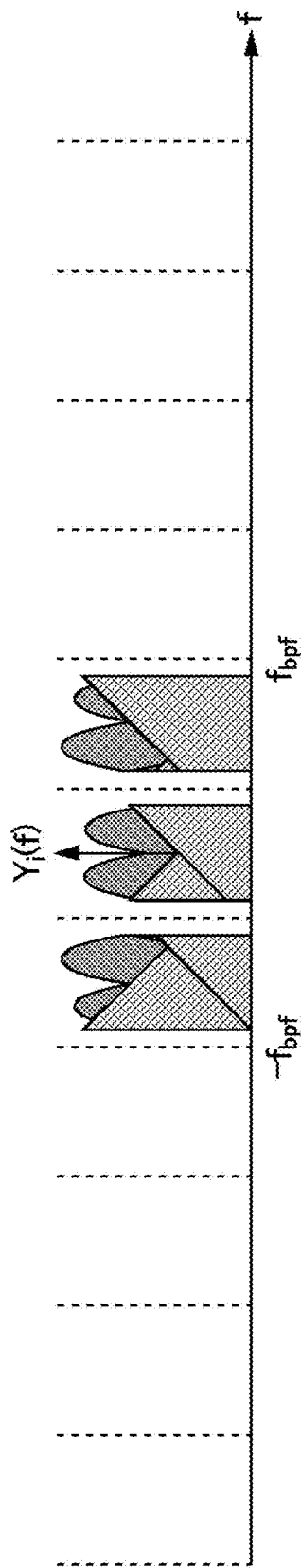
FIG. 6 shows an example of a waveform of a bandpass signal $Y_i(f)$ obtained by limiting a band of the signal, which is obtained by multiplying the input signal and the signal pattern, in the frequency domain.

FIG. 6 shows an example of a waveform of a bandpass signal $Y_i(f)$ obtained by limiting a band of the signal $Yp_i(f)$, which is obtained by multiplying the input signal $X(f)$ and the signal pattern $P_i(f)$, in the frequency domain. In the present embodiment, the bandpass filter 140 is a low-pass filter that performs low-pass filtering of passing a frequency component below a frequency $f_{bpf}$, and cuts off a frequency component with the frequency $f_{bpf}$ or higher. In this case as shown in FIG. 6, the bandpass filter 140 limits bands of a frequency component with a frequency $-f_{bpf}$ or lower and the frequency component with the frequency $f_{bpf}$ or higher in the signal $Yp_i(f)$ shown in FIG. 5, and performs the low-pass filtering of passing the frequency component above the frequency $-f_{bpf}$ and below frequency $f_{bpf}$. Here, the frequency $f_{bpf}$ may be twice or more the sampling frequency fs to realize sub-Nyquist sampling.

The bandpass signal $Y_i$ can be approximated by the discrete Fourier transform of the digital bandpass signal $y_i[n]$ as in the following Expression (3).

[Math. 3]

$$Y_i(e^{j2\pi fTs}) = \sum_{l=-\infty}^{\infty} y_i[n]e^{-j2\pi f nTs} = \sum_{l=-L_0}^{L_0} c_{i,l} X(f - lfp), \quad (3)$$

$$-fs/2 \le f \le fs/2$$

Here, $L_0$ is a positive integer selected such that all non-zero components of $X(f)$ are included in the range from $-fs/2 \le f \le fs/2$ of the bandpass signal $Y_i$. $L_0$ may be the smallest positive integer satisfying this condition.

Expression (3) can be represented in the form of a matrix-vector product shown in the following Expression (4).

[Math. 4]

$$\begin{pmatrix} Y_1(e^{j2\pi fTs}) \\ \vdots \\ Y_m(e^{j2\pi fTs}) \end{pmatrix} = \begin{pmatrix} c_{1,L_0} & \cdots & c_{1,-L_0} \\ \vdots & \ddots & \vdots \\ c_{m,L_0} & \cdots & c_{m,-L_0} \end{pmatrix} \begin{pmatrix} X(f - L_0 fp) \\ \vdots \\ X(f + L_0 fp) \end{pmatrix} \quad (4)$$

Figure 7:
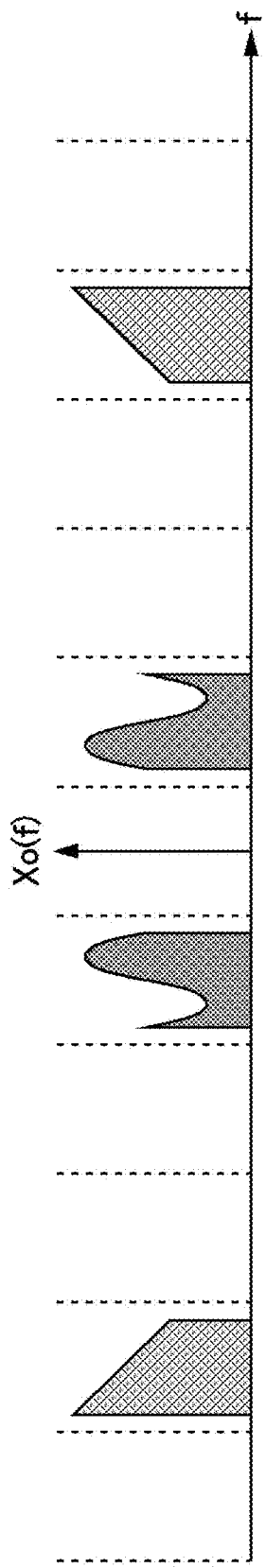
FIG. 7 shows an example of a waveform of an output signal Xo(f) reconstructed from bandpass signals $Y_i(f)$ in the frequency domain.

FIG. 7 shows an example of a waveform of an output signal $Xo(f)$ reconstructed from bandpass signals $Y_i(f)$ in the frequency domain. When a matrix of $c_{i,l}$ in Expression (4) is represented as A, a matrix A has m rows and $2L_0+1$ columns, and $2L_0+1$ is much greater than m, and thus it is difficult to uniquely calculate a vector of $X(f-lfp)$ on the right side from a vector of $Y_i$ on the left side. However, when the input signal $X(f)$ is sufficiently sparse, most of $X(f-lfp)$ on the right side is 0, and it is possible to uniquely calculate the vector of $X(f-lfp)$ on the right side from the vector of $Y_i$ on the left side by using a plurality of parameters $c_{i,l}$ included in the matrix A.

By such a principle, the reconstruction unit 160 converts each of the plurality of bandpass signals $y_i[n]$ into the bandpass signal $Y_i(f)$ in the frequency domain, uses the parameter for the reconstruction calculated from each frequency component $c_{i,l}$ of the signal pattern shown in FIG. 4 to reconstruct the output signal $Xo(f)$ in the frequency domain as shown in FIG. 3 from the plurality of bandpass signals $Y_i(f)$ in the frequency domain, and inversely converts the output signal $Xo(f)$ in the frequency domain into the output signal $xo(t)$ in the time domain, and thus it is possible to obtain the output signal $xo(t)$. Here, the reconstruction unit 160 may output the output signal $xo(t)$ in the form of a digital discrete time signal $xo[n]$.

Note that in the above description, an example of reconstructing $Xo(f)$ in the frequency domain from the bandpass signals $Y_i(f)$ in the frequency domain is shown. Alternatively, the conversion device 100 can also reconstruct the output signal $xo(t)$ in the time domain from the bandpass signals $y_i[n]$ in the time domain by using a calculation in the time domain equivalent to the above described calculation in the frequency domain.

Further, in the above description, the case where each bandpass filter 140 is the low-pass filter is shown. However, the above described processing can be similarly performed as long as bandpass filtering can be performed on signals in a frequency range sufficient to reconstruct the output signal $xo(t)$, and thus each bandpass filter 140 may be a bandpass filter.

With the conversion device 100 shown above, it is possible to sample the narrowband signal in such a wide frequency band including the frequency $-L_0 fp$ to the frequency $L_0 fp$ by using the plurality of AD converters 150 having the sampling frequency fs much smaller than the frequency $L_0 fp$. This makes it possible for the conversion device 100 to sample, for example, a narrowband signal of 20 MHz existing sparsely in a frequency band of several GHz to several tens of GHz by using the plurality of AD converters 150 having a sampling frequency of 80 MHz.

Figure 8:
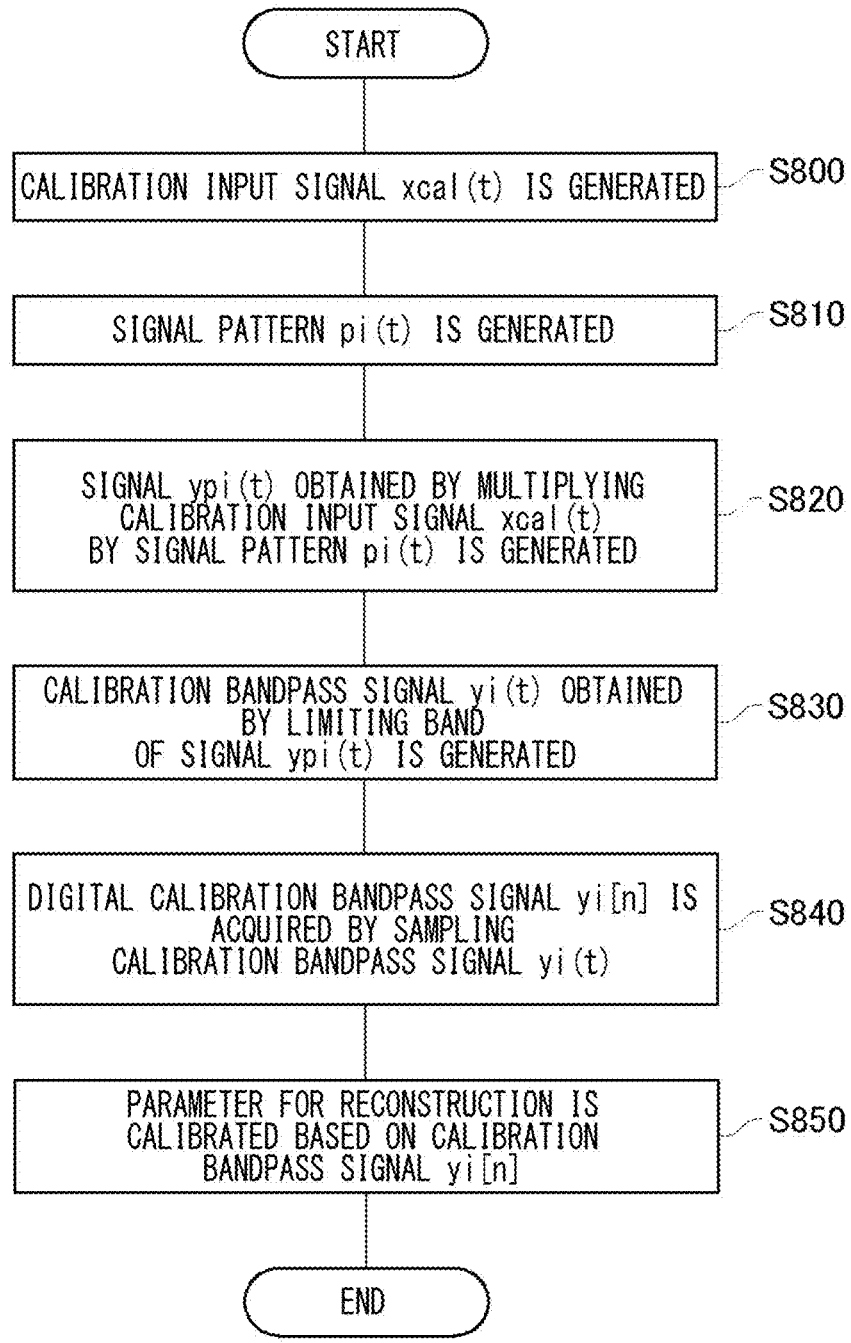
FIG. 8 shows an example of a calibration flow of the conversion device according to the present embodiment.

FIG. 8 shows an example of a calibration flow of the conversion device according to the present embodiment. In S800, the calibration signal supply unit 170 generates the calibration input signal xcal(t) in response to the instruction from the calibration processing unit 190 to start the calibration operation. In the calibration operation, the selector 110 supplies the calibration input signal xcal(t) to the plurality of mixers 130.

In S810, the plurality of periodic signal generators 120 generate the plurality of signal patterns $p_i(t)$, similarly to S210 during the normal operation. In S820, the plurality of mixers 130 generate and output the plurality of signals $yp_i(t)$ obtained by multiplying the calibration input signal xcal(t) by each of the plurality of signal patterns $p_i(t)$, similarly to S220 during the normal operation.

In S830, the plurality of bandpass filters 140 generate and output the plurality of calibration bandpass signals $y_i(t)$ obtained by limiting the bands of the plurality of signals $yp_i(t)$, similarly to S230 during the normal operation. In S840, the plurality of AD converters 150 output the plurality of digital calibration bandpass signals $y_i[n]$ by sampling and AD-converting the plurality of calibration bandpass signals $y_i(t)$, similarly to S240 during the normal operation. The calibration bandpass signal acquisition unit 180 acquires the plurality of the calibration bandpass signals $y_i[n]$ output by the plurality of AD converters 150.

In S850, the calibration processing unit 190 calibrates the parameter for the reconstruction used by the reconstruction unit 160 based on the plurality of calibration bandpass signals $y_i[n]$. Hereinafter, the calibration operation of the conversion device 100 will be described more specifically by using FIG. 9.

Figure 9:
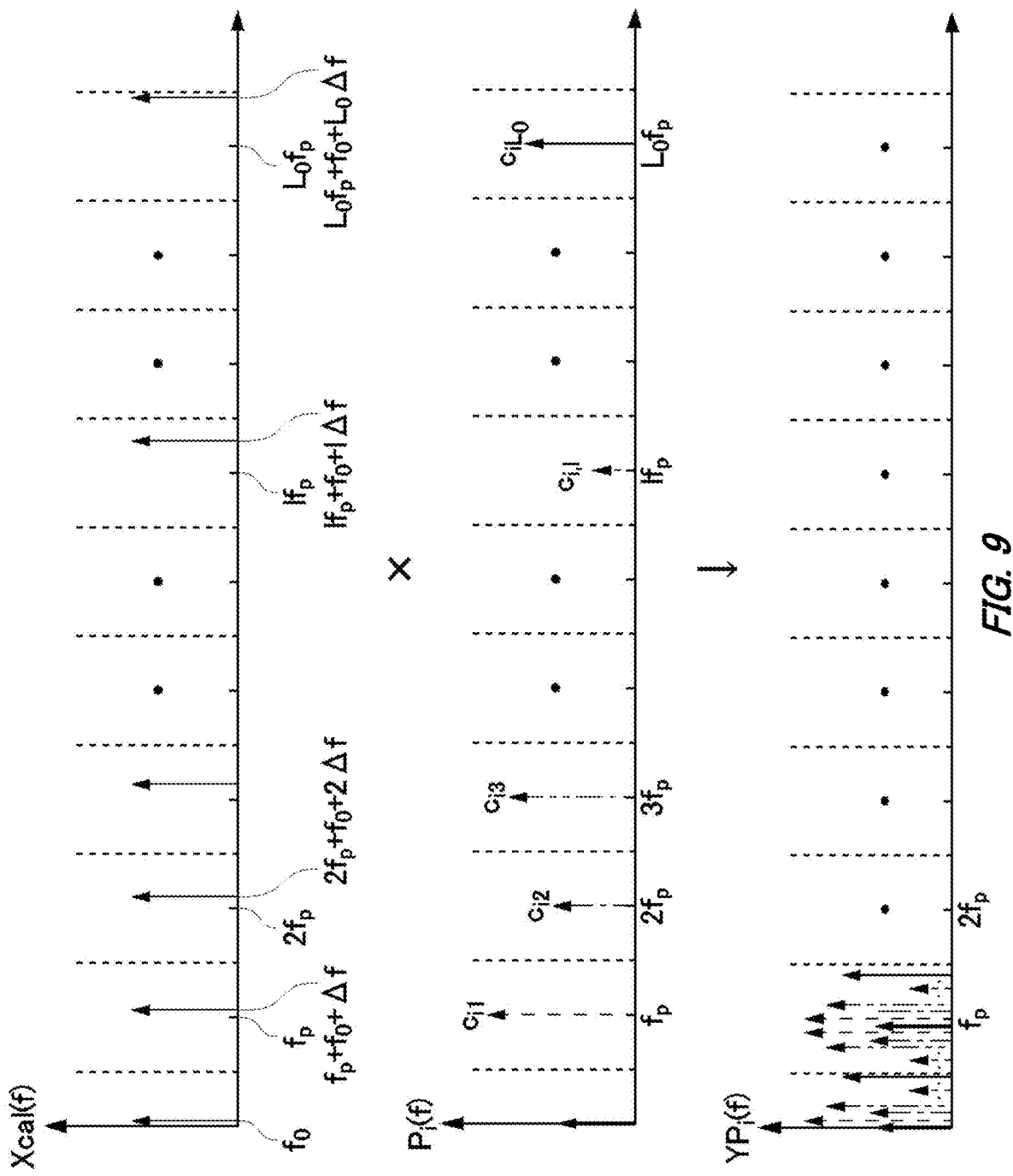
FIG. 9 shows an example of the waveform of the signal $Yp_i(f)$ obtained by multiplying a calibration input signal Xcal(f) and the signal pattern $P_i(f)$ in the frequency domain.

FIG. 9 shows an example of the waveform of the signal $Yp_i(f)$ obtained by multiplying a calibration input signal $Xcal(f)$ and the signal pattern $P_i(f)$ in the frequency domain. As shown in relation to FIG. 1 to FIG. 7, ideally, the conversion device 100 can correctly reconstruct the output signal $xo(t)$ in accordance with input signal $x(t)$ if given the frequency component $c_{i,l}$ of each signal pattern $p_i(t)$ that is an element of the matrix A. However, in reality, the conversion device 100 is very sensitive and is greatly affected by characteristics of components that are actually used, characteristics of wiring, and the like. Accordingly, in order to correctly reconstruct the output signal $xo(t)$, it is necessary to calibrate the conversion device 100.

Non-Patent Documents 3 to 8 disclose a technique for calibrating the parameter for the reconstruction by using a single tone calibration signal to sweep the frequency domain. However, in such a technique, it takes time to calculate all the parameters for the reconstruction from measurement results obtained by using single tone calibration signals generated at different timings. Further, since the single tone calibration signal is generated at each of the plurality of timings different from each other, there is a possibility of being affected by a phase shift due to random jitter in which these calibration signals are superimposed at the start timing, or the like, and there is a possibility that the parameter for the reconstruction cannot be set with high precision.

In contrast to this, as illustrated in a frequency spectrum in the upper part of FIG. 9, the calibration signal supply unit 170 according to the present embodiment supplies, as the calibration input signal $xcal(t)$, a multitone signal having tones in a plurality of frequency bands to the converter. The calibration input signal $xcal(t)$ may have a tone in each of the plurality of frequency bands which centers the frequency $l \cdot fp$ that is the integer multiple l of the repetition frequency $fp$ of the plurality of signal patterns $p_i(t)$, and has a width of the repetition frequency $fp$, the plurality of frequency bands being different from each other. In the wide frequency band, such a calibration input signal $xcal(t)$ has the tone in a band for each frequency $fp$, and thus is not a sparse signal as the narrowband signal which exists sparsely in the wide frequency band. Therefore, the reconstruction unit 160 cannot reconstruct the calibration input signal $xcal(t)$ as the output signal $xo(t)$. The mixer 130 multiplies such a calibration input signal $xcal(t)$ by the signal pattern $p_i(t)$ to be capable of frequency-converting the frequency components $c_{i,l}$, which are different from each other in signal pattern $p_i(t)$, to the vicinity of the baseband. As a result, the bandpass filter 140 causes the frequency components $c_{i,l}$ different from each other to be passed, and the AD converter 150 can sample the bandpass signal $y_i[n]$ including the frequency components $c_{i,l}$ different from each other.

The calibration input signal $xcal(t)$ may have the tones in the plurality of frequency bands obtained by dividing the frequency range as a detection target in the input signal $x(t)$ by each repetition frequency $fp$. When the frequency range as the detection target is 0 to $(L_0+\frac{1}{2})fp$, the calibration input signal $xcal(t)$ may have the tone in each frequency band which is obtained by dividing the frequency range as the detection target in the input signal $x(t)$ by each repetition frequency $fp$, and which centers the frequency $l \cdot fp$ (l=0 to $L_0$), as shown in the upper part of FIG. 9. Alternatively, the calibration input signal $xcal(t)$ may have a tone in each of the frequency bands corresponding to at least two l's.

Here, the tones in two different frequency bands among the plurality of frequency bands as described above may have a frequency difference offset from the integer multiple of the repetition frequency $fp$. By providing such a frequency difference between the two tones, and as a result of multiplying the calibration input signal $xcal(t)$ by the signal pattern $p_i(t)$, the bandpass filter 140 can cause the frequency components $c_{i,l}$, which are different from each other in signal pattern $p_i(t)$, to be frequency-converted to a position shifted by this frequency difference in the vicinity of the baseband. This makes it possible for the calibration processing unit 190 to separate and detect the frequency components $c_{i,l}$ different from each other in signal pattern $p_i(t)$ without a need to reconstruct the calibration input signal $xcal(t)$ by the reconstruction unit 160.

When a fundamental frequency is $f_0$, a repetition frequency is $fp$, an offset frequency is $\Delta f$, and l is an integer, the calibration input signal $xcal(t)$ shown in FIG. 9 has a tone with a frequency of $f_0+l \cdot fp+l\Delta f$ in the frequency range as the detection target. Such a calibration input signal $xcal(t)$ has a frequency difference of $fp+\Delta f$ between a tone in a certain frequency band, and a tone in a high frequency band adjacent to the certain frequency band. Here, the fundamental frequency $f_0$ may be $-\frac{1}{2}fp \leq f_0 \leq \frac{1}{2}fp$, and the offset frequency $\Delta f$ may be a positive or negative frequency such that all the tones do not deviate from a frequency band corresponding to a trigger generator 1010.

In a case where the $\Delta f$ is set as a positive micro frequency, when the calibration input signal $xcal(t)$ is multiplied by the signal pattern $p_i(t)$, the frequency components $c_{i,l}$ (l=0 to $L_0$) of each frequency $l \cdot fp$ of the signal pattern $P_i(f)$ in the frequency domain is compressed and arrayed in the same arrangement on a frequency axis in the vicinity of the baseband, so that the bandpass signal $Yp_i(f)$ is obtained as shown in the lower part of FIG. 9. Accordingly, the calibration processing unit 190 can detect the frequency component $c_{i,l}$ in order of frequency, from the bandpass signal $Yp_i(f)$ in the frequency domain. Note that when the $\Delta f$ is set as a negative micro frequency, the frequency component $c_{i,l}$ in the bandpass signal $Yp_i(f)$ is arranged in a reversed manner.

Note that in addition to the calibration input signal $xcal(t)$ shown in FIG. 9, the calibration input signal $xcal(t)$ may have a tone with a frequency of $f_0+l \cdot fp+q\Delta f$ in the frequency range as the detection target. Here, q may be an integer selected without duplication so as to satisfy $0 \leq q \leq L_0$ in the plurality of frequency bands, or may be an integer randomly selected under this condition.

In this way, in an i-th front end with the periodic signal generator 120-i, the mixer 130-i, the bandpass filter 140-i, and the AD converter 150-i, the conversion device 100 can acquire the plurality of frequency components $c_{i,l}$ (l=0 to $L_0$) of $P_i(f)$ from the bandpass signal $y_i[n]$ acquired in response to the multitone calibration input signal $xcal(t)$. Accordingly, the calibration processing unit 190 can collectively calibrate the plurality of parameters for the reconstruction corresponding to the plurality of frequency components $c_{i,l}$.

Further, in two or more or all of the front end, the conversion device 100 can acquire the plurality of frequency components $c_{i,l}$ (l=0 to $L_0$) of $P_i(f)$ from the bandpass signals $y_i[n]$ acquired in response to the multitone calibration input signals $xcal(t)$ which are supplied at the same timing. For two or more or all of i's in this case, the calibration processing unit 190 can collectively calibrate the plurality of the parameters for the reconstruction or all of the parameters for the reconstruction corresponding to the plurality of frequency components $c_{i,l}$.

Here, the plurality of frequency components $c_{i,l}$, which are acquired in response to the multitone calibration input signals xcal(t) which are supplied at the same timing, are not affected by the random jitter which occurs when the calibration input signals xcal(t) are supplied at different timings. Accordingly, the calibration processing unit 190 can calibrate the parameter for the reconstruction in the reconstruction unit 160 with high precision. In each of the plurality of front ends above described, there can be a time delay different for each front end between a timing when the periodic signal generator 120-$i$ generates the signal pattern $p_i(t)$, and a timing when the corresponding AD converter 150-$i$ samples the signal $y_i(t)$. In the conversion device 100, it is possible to acquire the plurality of frequency components $c_{i,l}$ (l=0 to $L_0$) of the signal pattern $P_i(f)$ in the frequency domain by using the multitone calibration input signals xcal(t) supplied to the plurality of front ends at the same timing, and thus the above described time delay for each front end can be reflected as a phase shift in the plurality of frequency components $c_{i,l}$ (l=0 to $L_0$) that are complex numbers including an amplitude and an initial phase. This makes it possible for the conversion device 100 to accurately offset an influence of the above described time delay for each front end in comparison with a case where the parameter for the reconstruction is constructed by sweeping the frequency domain by using the single tone calibration signal.

Note that in the above description, the simple case where each tone of the calibration input signal xcal(t) has an amplitude of 1 and a phase of 0 has been described as an example. When each tone has at least one of an amplitude which is not 1, and a phase which is not 0, each frequency component in the bandpass signal $Yp_i(f)$ is a product of the corresponding tone of the calibration input signal X(f) in the frequency domain, and the corresponding frequency component $c_{i,l}$ of the signal pattern $P_i(f)$ in the frequency domain. Accordingly, by dividing each frequency component in the bandpass signal $Yp_i(f)$ by the frequency component of the corresponding tone in the calibration input signal X(f), the calibration processing unit 190 can calculate the corresponding frequency component of the signal pattern $P_i(f)$.

Figure 10:
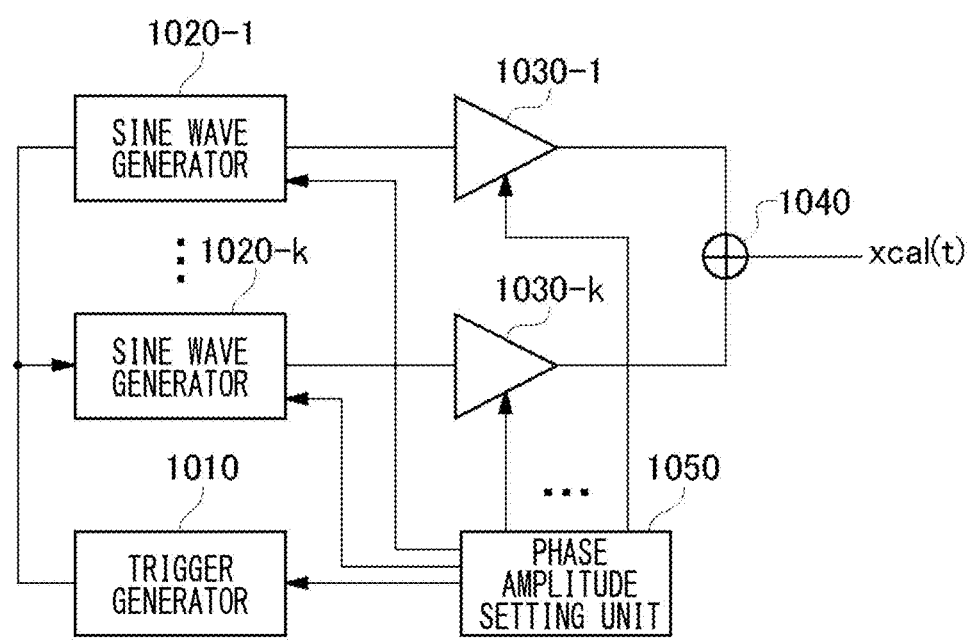
FIG. 10 shows a configuration of a calibration signal supply unit according to the present embodiment.

FIG. 10 shows a configuration of a calibration signal supply unit 1000 according to the present embodiment. The calibration signal supply unit 1000 may be used as the calibration signal supply unit 170 of FIG. 1, or may have a configuration different from that of the calibration signal supply unit 170 of FIG. 1.

The calibration signal supply unit 1000 includes a trigger generator 1010, a plurality of sine wave generators 1020-1 to k, a plurality of attenuators 1030-1 to k, a multiplexer 1040, and a phase amplitude setting unit 1050. The trigger generator 1010 generates the trigger indicating the start timing of the calibration input signal xcal(t). The trigger generator 1010 may periodically generate the calibration input signal xcal(t) by periodically generating the trigger.

The plurality of sine wave generators 1020-1 to k (also referred to as "sine wave generators 1020") are connected to the trigger generator 1010, and generate each tone to be included in the calibration input signal xcal(t). For example, the sine wave generator 1020-1 generates a tone with the frequency $f_0$ in FIG. 9, the sine wave generator 1020-2 generates a tone with a frequency of fp+$f_0$+Δf, ..., and the sine wave generator 1020-$k$ generates a tone with a frequency of $L_0$fp+$f_0$+$L_0$Δf. In this case, k is $L_0$+1. Here, each tone is a sine wave signal having a single frequency.

In the present embodiment, each sine wave generator 1020 receives, from the phase amplitude setting unit 1050, an instruction concerning the initial phase to output the tone, and outputs the tone having the initial phase specified with respect to the trigger. As the instruction concerning the initial phase to output the tone, each sine wave generator 1020 may receive an instruction concerning a delay time of the start timing of the tone with respect to a trigger.

The plurality of attenuators 1030-1 to k (also referred to as "attenuators 1030") are connected to the plurality of sine wave generators 1020, and respectively amplify or attenuate the amplitudes of the tones output by the corresponding sine wave generators 1020 according to weights specified by the phase amplitude setting unit 1050. Thereby, each attenuator 1030 outputs the tone obtained by multiplying the tone from the corresponding sine wave generator 1020 by the weight specified by the phase amplitude setting unit 1050.

The multiplexer 1040 is connected to the plurality of attenuators 1030. The multiplexer 1040 synthesizes (that is, adds) the tones which are output by the plurality of attenuators 1030, and in which at least either the amplitudes or the phases are adjusted, and outputs the synthesized tone as the calibration input signal xcal(t).

The phase amplitude setting unit 1050 instructs each sine wave generator 1020 on the initial phase of the tone to be output by each sine wave generator 1020. Further, the phase amplitude setting unit 1050 instructs each attenuator 1030 on the weight to be multiplied by the tone by each attenuator 1030. Thereby, the phase amplitude setting unit 1050 keeps a maximum amplitude of the calibration input signal xcal(t) within a rated range of the converter by performing at least one of shifting the initial phases of the plurality of tones, or adjusting the amplitudes of the plurality of tones.

More specifically, in order to correctly operate the converter including the plurality of mixers 130, the plurality of bandpass filters 140, and the plurality of AD converters 150, the calibration signal supply unit 1000 according to the present embodiment limits the amplitude of the calibration input signal within a rated range of the converter. Here, as the calibration signal supply unit 1000 supplies a synthesized wave of the plurality of tones to the converter as the calibration input signal, when peaks of a large number of tones are generated at the same time, the maximum amplitude of the synthesized wave is large. Therefore, the phase amplitude setting unit 1050 adjusts the initial phase on which the plurality of sine wave generators 1020 is instructed such that the peaks of the plurality of tones are shifted. Here, the phase amplitude setting unit 1050 may store a set of initial phases specified in advance by a manufacturer, a user, or the like of the conversion device 100 to set the stored initial phase for each sine wave generator 1020. Alternatively, the phase amplitude setting unit 1050 may calculate the maximum amplitude of the synthesized wave in accordance with the initial phases of the plurality of tones by a numerical calculation, a simulation, or the like to adjust the initial phase of each tone such that the amplitude of the synthesized wave is minimized. The phase amplitude setting unit 1050 may also keep the maximum amplitude of the calibration input signal xcal(t) within the rated range of the converter by setting the amplitudes of the plurality of tones to be substantially the same, and setting the phases of the plurality of tones to the Neuman phase described in Non-Patent Document 1.

Further, the multiplexer 1040 may limit the amplitude of the calibration input signal within the rated range of the converter by specifying the weight of the tone which is output, for each of the plurality of attenuators 1030, by the corresponding sine wave generator 1020. The phase amplitude setting unit 1050 may uniformly change the amplitudes of the plurality of tones, or may adjust each tone such that the amplitudes of at least two tones are different. Here, the phase amplitude setting unit 1050 may store a set of weights specified in advance by a manufacturer, a user, or the like of the conversion device 100 to set the stored weight for each attenuator 1030. Alternatively, the phase amplitude setting unit 1050 may calculate the maximum amplitude of the synthesized wave in accordance with the amplitudes of the plurality of tones by a numerical calculation, a simulation, or the like to make the adjustment such that the amplitude of the synthesized wave is minimized. For example, at a timing when the synthesized wave has the maximum amplitude, the phase amplitude setting unit 1050 may adjust the amplitude of the tone, which greatly contributes to an increase in the amplitude of the synthesized wave, to be smaller. The phase amplitude setting unit 1050 may adjust the initial phase of each tone and the amplitude of each tone in combination to keep the maximum amplitude of the synthesized wave within the rated range of the converter.

In the above description, when the conversion device 100 excludes any of the plurality of frequency bands from a measurement target, the calibration signal supply unit 1000 may have a configuration which does not include a set of the sine wave generator 1020 and the attenuator 1030 corresponding to the frequency band. Note that a method, in which instead of some or all of the plurality of sine wave generators 1020 and the plurality of attenuators 1030, a computer generates the synthesized wave of some or all of the corresponding tones by using a calculation by program processing, and a DA converter or an arbitrary waveform generator (AWG: Arbitrary Waveform Generator) analog-converts and outputs the generated synthesized wave, may be used.

Figure 11:
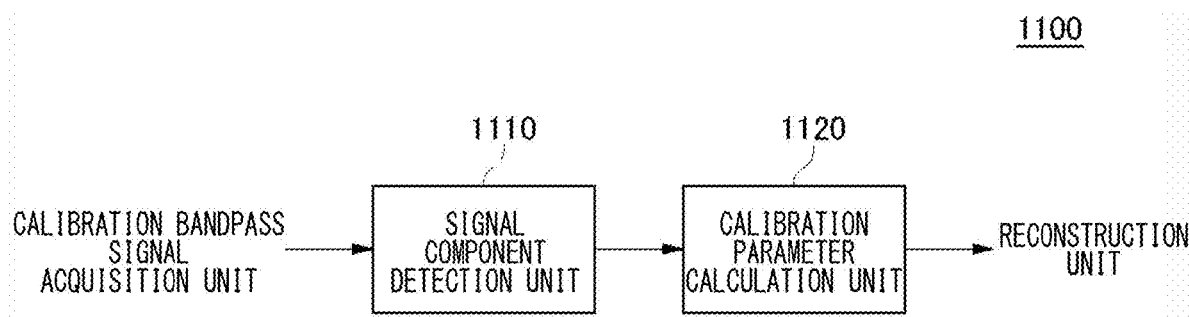
FIG. 11 shows a configuration of a calibration processing unit according to the present embodiment.

FIG. 11 shows a configuration of a calibration processing unit 1100 according to the present embodiment. The calibration processing unit 1100 may be used as the calibration processing unit 190 of FIG. 1, or may have a configuration different from that of the calibration processing unit 190 of FIG. 1.

The calibration processing unit 1100 has a signal component detection unit 1110 and a calibration parameter calculation unit 1120. The signal component detection unit 1110 is connected to a calibration bandpass signal acquisition unit such as the calibration bandpass signal acquisition unit 180, and detects, from each of the plurality of bandpass signals $y_i[n]$, each frequency component $c_{i,j}$ included in the corresponding signal pattern $p_i(t)$. The signal component detection unit 1110 according to the present embodiment converts each of the plurality of bandpass signals $y_i[n]$ into the bandpass signal $Y_i(f)$ in the frequency domain by the discrete Fourier transform (refer to Expression (3)). Then, the signal component detection unit 1110 extracts the frequency component corresponding to each frequency component $c_{i,j}$ included in the signal pattern $p_i(t)$ from the bandpass signal $Y_i(f)$ in the frequency domain. Here, the calibration input signal $xcal(t)$ is known, and thus the signal component detection unit 1110 can back calculate, from each of the extracted frequency components, the amplitude and the initial phase of each frequency component $c_{i,j}$ included in the signal pattern $p_i(t)$.

The calibration parameter calculation unit 1120 is connected to the signal component detection unit 1110, and uses each frequency component $c_{i,j}$ to calculate the parameter for the reconstruction which is for calculating a signal of each frequency band of an output signal $X(f)$ in the frequency domain (that is, the vector of $X(f-lfp)$ on the right side of Expression (4)) from the plurality of bandpass signals $Y_i(f)$ in the frequency domain (that is, the vector on the left side of Expression (4)). Here, the output signal $X(f)$ in the frequency domain is sufficiently sparse, and thus if the frequency band in which there is no signal for the output signal $X(f)$ is known, it is possible to delete, from Expression (4), $X(f-lfp)$ corresponding to that frequency band, and a column of the matrix A corresponding to that $X(f-lfp)$. Then, the calibration parameter calculation unit 1120 calculates a generalized inverse (denoted as B) of such a degenerate matrix A to set the generalized inverse as the parameter for the reconstruction. It is possible for the reconstruction unit 160 to use the parameter for the reconstruction obtained in this way, to convert the plurality of bandpass signals $y_i[n]$ in accordance with the input signal $x(t)$ into the plurality of bandpass signals $Y_i(f)$ in the frequency domain by the discrete Fourier transform, and to obtain the plurality of signals $X(f-lfp)$ included in the output signal $X(f)$ by multiplying the vectors of the plurality of bandpass signals $Y_i(f)$ by the matrix B.

Alternatively, the calibration parameter calculation unit 1120 may supply each frequency component $c_{i,j}$ to the reconstruction unit 160 as the parameter for the reconstruction. In this case, from a value of each frequency component $c_{i,j}$ which is the parameter for the reconstruction, the reconstruction unit 160 may calculate the generalized inverse B, and then calculate the output signal $X(f)$.

Here, when the frequency band in which there is no signal for the output signal $X(f)$ is unknown, the reconstruction unit 160 may detect a frequency band in which there is a signal for the output signal $X(f)$, and then perform the above described processing. As an example, the reconstruction unit 160 may reconstruct the output signal $X(f)$ by using the method described in Non-Patent Document 1.

Note that the calibration processing unit 1100 according to the present embodiment calculates the parameter for the reconstruction by using the calculation in the frequency domain. Alternatively, the calibration processing unit 1100 may calculate the parameter for the reconstruction by using a calculation in the time domain corresponding to the calculation in the frequency domain described above.

Various embodiments of the present invention may be described with reference to flowcharts and block diagrams, and blocks in the flowcharts and the block diagrams may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits, or may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device. As a result, the computer-readable medium having instructions stored in the tangible device comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of computer-readable media may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a Blu-ray (registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk (registered trademark), JAVA (registered trademark), C++, etc., and conventional procedural programming languages, such as the "C" programming language or similar programming languages.

Computer-readable instructions may be provided to a processor of a general-purpose computer, special purpose computer, or a programmable data processing apparatus of another computer, etc., or to programmable circuitry, locally or via a local area network (LAN), wide area network (WAN) such as the Internet, etc., so that the computer-readable instructions is executed to create means for performing operations specified in the flowcharts or block diagrams. Examples of processors include computer processors, processing units, microprocessors, digital signal processors, controllers, microcontrollers, etc.

Figure 12:
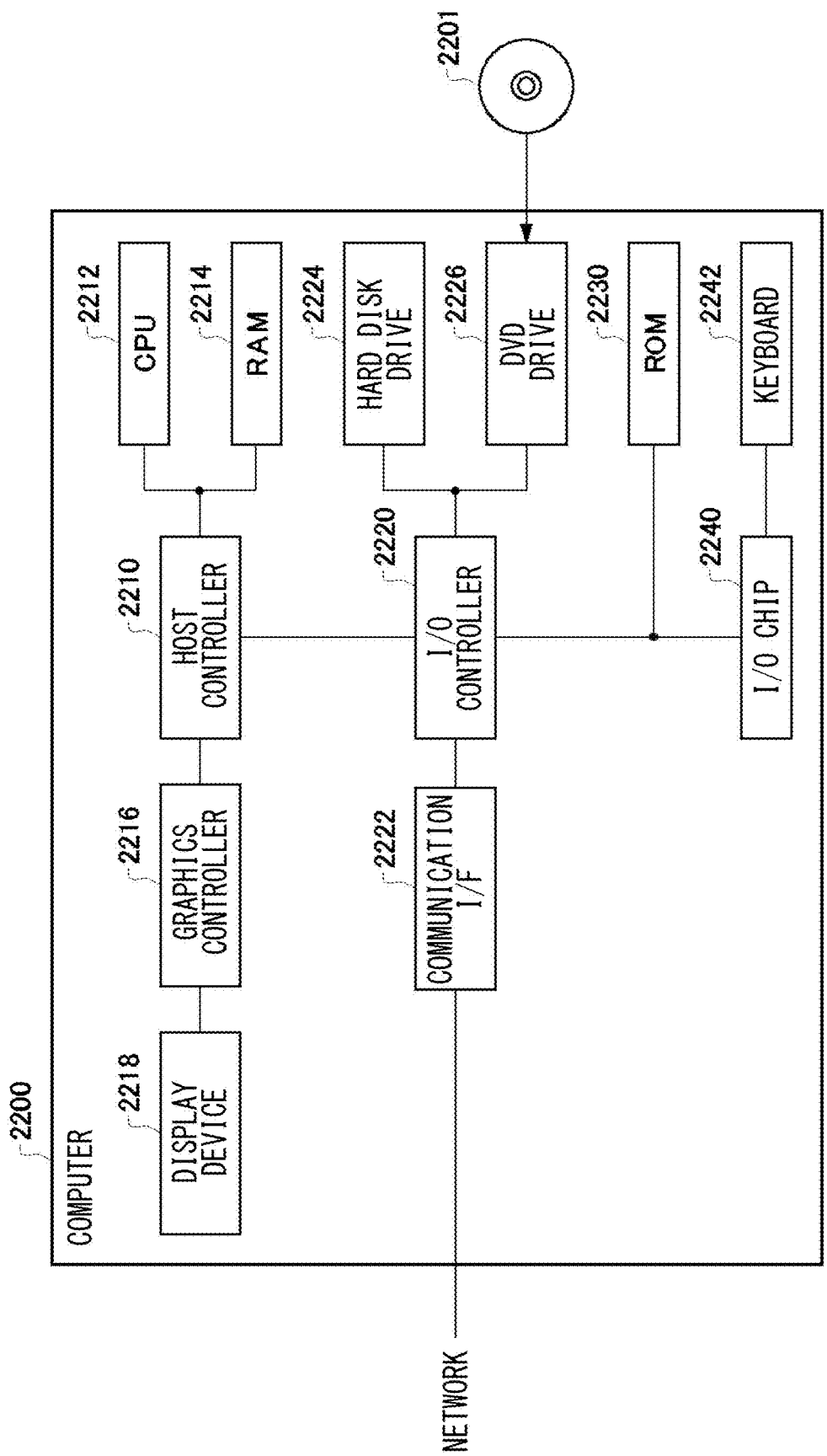
FIG. 12 shows an example of a computer in which a plurality of aspects of the present invention may be embodied entirely or partially.

FIG. 12 shows an example of a computer 2200 in which a plurality of aspects of the present invention may be embodied entirely or partially. A program that is installed on the computer 2200 can cause the computer 2200 to function for operations associated with an apparatus according to the embodiment of the present invention or as one or more sections in the apparatus, or cause the computer 2200 to perform the operations or the one or more sections thereof, and/or cause the computer 2200 to perform processes of the embodiment of the present invention or steps thereof. Such a program may be performed by a CPU 2212 so as to cause the computer 2200 to perform certain operations associated with some or all of the blocks of flowcharts and block diagrams described herein.

The computer 2200 according to the present embodiment includes the CPU 2212, a RAM 2214, a graphics controller 2216, and a display device 2218, which are interconnected by a host controller 2210. The computer 2200 also includes a communication interface 2222, a hard disk drive 2224, a DVD-ROM drive 2226, and an input/output unit such as an IC card drive, which are connected to the host controller 2210 via an input/output controller 2220. The computer also includes a ROM 2230 and a legacy input/output unit such as a keyboard 2242, which are connected to the input/output controller 2220 via an input/output chip 2240.

The CPU 2212 operates according to the programs stored in the ROM 2230 and the RAM 2214, thereby controlling each unit. The graphics controller 2216 acquires image data which is generated, by the CPU 2212, in a frame buffer or the like provided in the RAM 2214 or in itself so as to cause the image data to be displayed on the display device 2218.

The communication interface 2222 communicates with another electronic device via the network. The hard disk drive 2224 stores the program and data used by the CPU 2212 in the computer 2200. The DVD-ROM drive 2226 reads the program or the data from a DVD-ROM 2201, and provides the program or the data to the hard disk drive 2224 via the RAM 2214. The IC card drive reads the program and data from an IC card, and/or writes the program and data to the IC card.

The ROM 2230 stores, in itself, a boot program or the like that is executed by the computer 2200 during activation, and/or a program that depends on hardware of the computer 2200. Further, the input/output chip 2240 may connect various input/output units to the input/output controller 2220 via a parallel port, serial port, keyboard port, mouse port, or the like.

The program is provided by a computer-readable medium such as the DVD-ROM 2201 or the IC card. The program is read from the computer-readable medium, installed on the hard disk drive 2224, the RAM 2214, or the ROM 2230, which is also an example of the computer-readable medium, and executed by the CPU 2212. Information processing written in these programs is read by the computer 2200, resulting in cooperation between a program and various types of hardware resources described above. An apparatus or a method may be constituted by realizing the operation or processing of information in accordance with the usage of the computer 2200.

For example, when a communication is executed between the computer 2200 and an external device, the CPU 2212 may execute a communication program loaded in the RAM 2214, and instruct the communication interface 2222 to process the communication based on the processing written in the communication program. Under the control of the CPU 2212, the communication interface 2222 reads transmission data stored in a transmission buffering region provided in a recording medium such as the RAM 2214, the hard disk drive 2224, the DVD-ROM 2201, or the IC card, transmits the read transmission data to the network, or writes received data which is received from the network to a reception buffering region or the like provided on the recording medium.

Further, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card, etc., and perform various types of processing on the data on the RAM 2214. Then, the CPU 2212 writes back the processed data to the external recording medium.

Various types of information such as various types of programs, data, tables, and databases may be stored in recording media to undergo information processing. The CPU 2212 may execute various types of processing on the data read from the RAM 2214 to write back a result to the RAM 2214, the processing being described throughout the present disclosure, specified by an instruction sequence of the programs, and including various types of operations, processing of information, condition determinations, conditional branch, unconditional branch, information retrievals/replacements, or the like. Further, the CPU 2212 may search for information in the file, the database, or the like in the recording medium. For example, when a plurality of entries each having an attribute value of a first attribute associated with an attribute value of a second attribute are stored in the recording medium, the CPU 2212 may search, from among the plurality of entries, for an entry matching a condition in which the attribute value of the first attribute is specified, and read the attribute value of the second attribute stored in the entry, thereby acquiring the attribute value of the second attribute associated with the first attribute that satisfies a predetermined condition.

The program or software module described above may be stored on the computer 2200 or in a computer-readable medium near the computer 2200. Further, a recording medium such as a hard disk or a RAM provided in a server system connected to a dedicated communication network or the Internet can be used as the computer-readable medium, thereby providing the program to the computer 2200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A calibration device, comprising:
    a calibration signal supply unit configured to supply, as a calibration input signal, a multitone signal having tones in a plurality of frequency bands to a converter configured to multiply an input signal by each of a plurality of signal patterns and limit a band to obtain each of a plurality of bandpass signals, and reconstruct an output signal in accordance with the input signal from the plurality of bandpass signals;
    a calibration bandpass signal acquisition unit configured to acquire a plurality of calibration bandpass signals obtained by the converter in response to the multitone signal; and
    a calibration processing unit configured to calibrate a parameter for a reconstruction in the converter based on the plurality of calibration bandpass signals.

2. The calibration device according to claim 1, wherein the calibration input signal has a tone in each of the plurality of frequency bands which centers a frequency that is an integer multiple of a repetition frequency of the plurality of signal patterns, and has a width of the repetition frequency, the plurality of frequency bands being different from each other.

3. The calibration device according to claim 2, wherein tones in two different frequency bands among the plurality of frequency bands have a frequency difference offset from the integer multiple of the repetition frequency.

4. The calibration device according to claim 3, wherein the calibration input signal has tones in the plurality of frequency bands obtained by dividing a frequency range as a detection target in the input signal by each of the repetition frequency.

5. The calibration device according to claim 4, wherein when a fundamental frequency is $f_0$, the repetition frequency is $f_p$, an offset frequency is $\Delta f$, and l is an integer, the calibration input signal has a tone with a frequency of $f_0+l\cdot f_p+l\Delta f$ in a frequency range as the detection target.

6. The calibration device according to claim 1, wherein the calibration signal supply unit is configured to shift initial phases of a plurality of tones to keep a maximum amplitude of the calibration input signal within a rated range of the converter.

7. The calibration device according to claim 2, wherein the calibration signal supply unit is configured to shift initial phases of a plurality of tones to keep a maximum amplitude of the calibration input signal within a rated range of the converter.

8. The calibration device according to claim 3, wherein the calibration signal supply unit is configured to shift initial phases of a plurality of tones to keep a maximum amplitude of the calibration input signal within a rated range of the converter.

9. The calibration device according to claim 4, wherein the calibration signal supply unit is configured to shift initial phases of a plurality of tones to keep a maximum amplitude of the calibration input signal within a rated range of the converter.

10. The calibration device according to claim 5, wherein the calibration signal supply unit is configured to shift initial phases of a plurality of tones to keep a maximum amplitude of the calibration input signal within a rated range of the converter.

11. A conversion device comprising:
    a converter configured to multiply an input signal by each of a plurality of signal patterns and limit a band to obtain each of a plurality of bandpass signals, and reconstruct an output signal in accordance with an input signal from the plurality of bandpass signals; and
    the calibration device according to claim 1.

12. A conversion device comprising:
    a converter configured to multiply an input signal by each of a plurality of signal patterns and limit a band to obtain each of a plurality of bandpass signals, and reconstruct an output signal in accordance with an input signal from the plurality of bandpass signals; and
    the calibration device according to claim 2.

13. A conversion device comprising:
    a converter configured to multiply an input signal by each of a plurality of signal patterns and limit a band to obtain each of a plurality of bandpass signals, and reconstruct an output signal in accordance with an input signal from the plurality of bandpass signals; and
    the calibration device according to claim 3.

14. A conversion device comprising:
    a converter configured to multiply an input signal by each of a plurality of signal patterns and limit a band to obtain each of a plurality of bandpass signals, and reconstruct an output signal in accordance with an input signal from the plurality of bandpass signals; and
    the calibration device according to claim 4.

15. A conversion device comprising:
    a converter configured to multiply an input signal by each of a plurality of signal patterns and limit a band to obtain each of a plurality of bandpass signals, and reconstruct an output signal in accordance with an input signal from the plurality of bandpass signals; and
    the calibration device according to claim 5.

16. A conversion device comprising:
  a converter configured to multiply an input signal by each of a plurality of signal patterns and limit a band to obtain each of a plurality of bandpass signals, and reconstruct an output signal in accordance with an input signal from the plurality of bandpass signals; and
  the calibration device according to claim 6.

17. A conversion device comprising:
  a converter configured to multiply an input signal by each of a plurality of signal patterns and limit a band to obtain each of a plurality of bandpass signals, and reconstruct an output signal in accordance with an input signal from the plurality of bandpass signals; and
  the calibration device according to claim 7.

18. The conversion device according to claim 11, wherein the converter has:
  a plurality of mixers configured to multiply the input signal by each of the plurality of signal patterns;
  a plurality of bandpass filters configured to respectively limit bands of a plurality of signals, which are output by the plurality of mixers;
  a plurality of AD converters configured to output the plurality of bandpass signals obtained by respectively sampling signals that have passed through the plurality of bandpass filters; and
  a reconstruction unit configured to reconstruct the output signal from the plurality of bandpass signals.

19. A calibration method comprising:
  supplying, as a calibration input signal, a multitone signal having tones in a plurality of frequency bands to a converter configured to multiply an input signal by each of a plurality of signal patterns and limit a band to obtain each of a plurality of bandpass signals, and reconstruct an output signal in accordance with an input signal from the plurality of bandpass signals;
  acquiring a plurality of calibration bandpass signals obtained by the converter in response to the multitone signal; and
  calibrating a parameter for a reconstruction in the converter based on the plurality of calibration bandpass signals.

20. A non-transitory computer-readable medium having recorded thereon a calibration program that is executed by a computer and causes the computer to function as:
  a calibration signal supply unit configured to supply, as a calibration input signal, a multitone signal having tones in a plurality of frequency bands to a converter configured to multiply an input signal by each of a plurality of signal patterns and limit a band to obtain each of a plurality of bandpass signals, and reconstruct an output signal in accordance with an input signal from the plurality of bandpass signals;
  a calibration bandpass signal acquisition unit configured to acquire a plurality of calibration bandpass signals obtained by the converter in response to the multitone signal; and
  a calibration processing unit configured to calibrate a parameter for a reconstruction in the converter based on the plurality of calibration bandpass signals.

\* \* \* \* \*